(12) United States Patent
Lee et al.

(10) Patent No.: US 10,976,409 B2
(45) Date of Patent: Apr. 13, 2021

(54) FREQUENCY-MODULATED CONTINUOUS WAVE GENERATOR AND FREQUENCY-MODULATED CONTINUOUS WAVE RADAR SYSTEM INCLUDING THE SAME

(71) Applicant: ELECTRONICS AND TELECOMMUNICATIONS RESEARCH INSTITUTE, Daejeon (KR)

(72) Inventors: Ja Yol Lee, Nonsan-si (KR); Bon Tae Koo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 519 days.

(21) Appl. No.: 15/818,667

(22) Filed: Nov. 20, 2017

(65) Prior Publication Data

US 2018/0143296 A1 May 24, 2018

(30) Foreign Application Priority Data

Nov. 21, 2016 (KR) .................. 10-2016-0155309
Oct. 17, 2017 (KR) .................. 10-2017-0134833

(51) Int. Cl.
*G01S 7/35* (2006.01)
*H03F 3/21* (2006.01)
(Continued)

(52) U.S. Cl.
CPC ............. *G01S 7/35* (2013.01); *G01S 13/343* (2013.01); *G01S 13/345* (2013.01); *H03F 3/19* (2013.01); *H03F 3/21* (2013.01); *H03L 1/02* (2013.01); *H03L 7/089* (2013.01); *H03L 7/0891* (2013.01); *H03L 7/093* (2013.01); *H03L 7/12* (2013.01); *H03B 5/04* (2013.01); *H03B 5/32* (2013.01);
(Continued)

(58) Field of Classification Search
None
See application file for complete search history.

(56) References Cited

U.S. PATENT DOCUMENTS 6,664,920 B1 * 12/2003 Mott ................ G01S 13/343
342/129
8,432,199 B2   4/2013 Lee et al.
(Continued)

OTHER PUBLICATIONS

ViaSat, "Single Chip 24 GHz Radar Transceiver", 2014, pp. 1-2.
(Continued)

*Primary Examiner* — Whitney Moore
(74) *Attorney, Agent, or Firm* — Rabin & Berdo, P.C.

(57) ABSTRACT

Provided is frequency-modulated continuous wave generator. The frequency-modulated continuous wave generator includes a ramp signal generator configured to generate an analog ramp signal, a reference signal generator configured to generate a reference signal based on the analog ramp signal, a phase locked loop configured to output a control voltage based on the reference signal, and a voltage-controlled oscillator configured to generate a frequency-modulated continuous wave based on the control voltage. The ramp signal generator is further configured to generate the analog ramp signal based on a feedback signal based on the frequency-modulated continuous wave.

15 Claims, 10 Drawing Sheets

(51) Int. Cl.
     *H03F 3/19*    (2006.01)
     *H03L 7/089*   (2006.01)
     *H03L 7/093*   (2006.01)
     *H03L 1/02*    (2006.01)
     *H03L 7/12*    (2006.01)
     *G01S 13/34*   (2006.01)
     *H03B 5/04*    (2006.01)
     *H03B 5/32*    (2006.01)

(52) U.S. Cl.
     CPC .. *H03F 2200/294* (2013.01); *H03F 2200/451* (2013.01)

(56) References Cited

U.S. PATENT DOCUMENTS

| | | | |
|---|---|---|---|
| 8,731,502 B2 | 5/2014 | Salle et al. | |
| 2005/0013343 A1* | 1/2005 | Giunco | H03L 7/095 375/130 |
| 2006/0126754 A1* | 6/2006 | Filimonov | H03F 1/0277 375/296 |
| 2016/0373121 A1 | 12/2016 | Lee et al. | |
| 2017/0214510 A1* | 7/2017 | Sano | H04L 5/0048 |
| 2018/0006655 A1* | 1/2018 | Kim | H03L 7/23 |
| 2018/0136328 A1* | 5/2018 | Moss | G01S 13/584 |

OTHER PUBLICATIONS

STMicroelectronics, "A431: 24-GHz Transceiver MMIC for Automotive Radar Sensor", draft V2.1, Sep. 9, 2015, pp. 1-31.
Infineon Technology AG, "Single-Chip 24 GHz Radar Front End", Microwave Journal, Feb. 13, 2014, pp. 1-2.
John Morrissey et al., "High Performance Integrated 24 GHz FMCW Radar Transceiver Chipset for Auto and Industrial Sensor Applications", Analog Devices, 2015, pp. 1-4.

* cited by examiner

FREQUENCY-MODULATED CONTINUOUS WAVE GENERATOR AND FREQUENCY-MODULATED CONTINUOUS WAVE RADAR SYSTEM INCLUDING THE SAME

CROSS-REFERENCE TO RELATED APPLICATIONS

This U.S. non-provisional patent application claims priority under 35 U.S.C. § 119 of Korean Patent Application Nos. 10-2016-0155309, filed on Nov. 21, 2017, and 10-2017-0134833, filed on Oct. 17, 2017, the entire contents of which are hereby incorporated by reference.

BACKGROUND

The present disclosure relates to a device for generating a frequency-modulated continuous wave, and more particularly, to a device for generating a frequency-modulated continuous wave using an analog ramp signal and a frequency-modulated continuous wave radar system including the same.

Recently, there have been many studies on a frequency-modulated continuous wave (FMCW) type transceiver in implementing radar to detect small targets. Particularly, with the development of semiconductor process technology, the integration degree/resolution of a CMOS device is increased, and a frequency synthesizer for generating an FMCW signal is actively developed and studied.

Generally, in an FMCW radar, the FMCW frequency modulation width is increased in order to accurately detect/track a target and increase a distance resolution. However, it is difficult to implement a broadband FMCW signal generator, which is a core component of an FMCW radar, and various existing devices for sweeping frequency modulation at a high speed have a complicated structure or a large power consumption. In addition, improving the frequency linearity of the FMCW is an important issue directly related to the performance of the FMCW radar.

Therefore, it is very important to overcome the shortcomings of existing frequency synthesizers and develop a high-speed FMCW signal generator with improved frequency linearity of an FMCW.

SUMMARY

The present disclosure provides a device for generating a high-speed FMCW with improved linearity using an analog ramp signal generator and an FMCW radar system including the same.

An embodiment of the inventive concept provides a frequency-modulated continuous wave generator including: a ramp signal generator configured to generate an analog ramp signal; a reference signal generator configured to generate a reference signal based on the analog ramp signal; a phase locked loop configured to output a control voltage based on the reference signal; and a voltage-controlled oscillator configured to generate a frequency-modulated continuous wave based on the control voltage, wherein the ramp signal generator generates the analog ramp signal based on a feedback signal based on the frequency-modulated continuous wave.

In an embodiment, the ramp signal generator may include: a pulse generator configured to generate a plurality of pulses based on the feedback signal; a capacitor configured to store charges of a current source according to the plurality of pulses; and an operational amplifier configured to amplify a potential difference across the capacitor.

In an embodiment, the reference signal generator may be a voltage-controlled crystal oscillator (VCXO), and the reference signal generator may generate the reference signal based on an output voltage of the operational amplifier.

In an embodiment, the phase locked loop may include: a phase frequency detector configured to detect a phase difference between the reference signal and the feedback signal; a charge pump configured to generate a control current based on signals outputted from the phase frequency detector; a loop filter configured to convert the control current to the control voltage; and a divider configured to count or divide the frequency-modulated continuous wave to generate the feedback signal.

In an embodiment, the feedback signal may include a plurality of pulses whose logic high section is increased linearly.

In an embodiment, the pulse generator may be implemented with at least one of a divider, a phase locked loop, a delay locked loop, and a programmable pulse generator.

In an embodiment, the frequency-modulated continuous wave generator may further include a temperature sensor configured to sense a temperature of the frequency-modulated continuous wave generator, wherein the reference signal generator may be configured to generate the reference signal by further considering a detection result of the temperature sensor.

The reference signal generator may be a voltage-controlled temperature-controlled crystal oscillator (VCTCXO).

In an embodiment of the inventive concept, a frequency-modulated continuous wave radar system includes: a reference signal generator configured to generate a reference signal based on an analog ramp signal; a phase locked loop configured to output a control voltage based on the reference signal; a voltage-controlled oscillator configured to generate a frequency-modulated continuous wave based on the control voltage; a ramp signal generator configured to generate the analog ramp signal based on a feedback signal based on the frequency-modulated continuous wave; a mixer configured to mix a reception signal obtained by reflecting a transmission signal based on the frequency-modulated continuous wave by a target with the frequency-modulated continuous wave to generate an intermediate frequency signal; and a digital signal processor configured to calculate information about the target based on the intermediate frequency signal.

In an embodiment, the ramp signal generator may include: a pulse generator configured to generate a plurality of pulses based on the feedback signal; a capacitor configured to store charges of a current source according to the plurality of pulses; and an operational amplifier configured to amplify a potential difference across the capacitor.

In an embodiment, the reference signal generator may be a voltage-controlled crystal oscillator (VCXO), and the reference signal generator may generate the reference signal based on an output voltage of the operational amplifier.

In an embodiment, the phase locked loop may include: a phase frequency detector configured to detect a phase difference between the reference signal and the feedback signal; a charge pump configured to generate a control current based on signals outputted from the phase frequency detector; a loop filter configured to convert the control current to the control voltage; and a divider configured to count or divide the frequency-modulated continuous wave to generate the feedback signal.

In an embodiment, the pulse generator may be implemented with at least one of a divider, a phase locked loop, a delay locked loop, and a programmable pulse generator.

In an embodiment, the frequency-modulated continuous wave radar system may further include a temperature sensor configured to sense a temperature of the frequency-modulated continuous wave generator, wherein the reference signal generator may be configured to generate the reference signal by further considering a detection result of the temperature sensor.

In an embodiment, the reference signal generator may be a voltage-controlled temperature-controlled crystal oscillator (VCTCXO).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the inventive concept will be described in more detail with reference to the accompanying drawings. In the description below, details such as detailed configurations and structures are simply provided to help overall understanding. Therefore, without departing from the technical idea and scope of the inventive concept, modifications on embodiments described in this specification may be performed by those skilled in the art. Furthermore, descriptions of well-known functions and structures are omitted for clarity and conciseness. The terms used herein are defined in consideration of functions of the inventive concept and are not limited to specific functions. The definition of terms may be determined based on the details in description.

Modules in drawings or detailed description below may be shown in the drawings or may be connected to another component other than components described in detailed description. Each of connections between modules or components may be direct or indirect. Each of connections between modules or components may be a connection by communication or a physical access.

Components described with reference to terms such as parts, units, modules, and layers used in detailed description may be implemented in software, hardware, or a combination thereof. Exemplarily, software may be machine code, firmware, embedded code, and application software. For example, hardware may include an electrical circuit, an electronic circuit, a processor, a computer, an integrated circuit, integrated circuit cores, a pressure sensor, an inertial sensor, microelectromechanical systems (MEMS), a passive device, or a combination thereof.

Unless otherwise defined, all terms including technical or scientific meanings used in the specification have meanings understood by those skilled in the art. In general, the terms defined in the dictionary are interpreted to have the same meanings as contextual meanings and unless they are clearly defined in the specification, are not to be interpreted to have ideal or excessively formal meanings.

Figure 1:
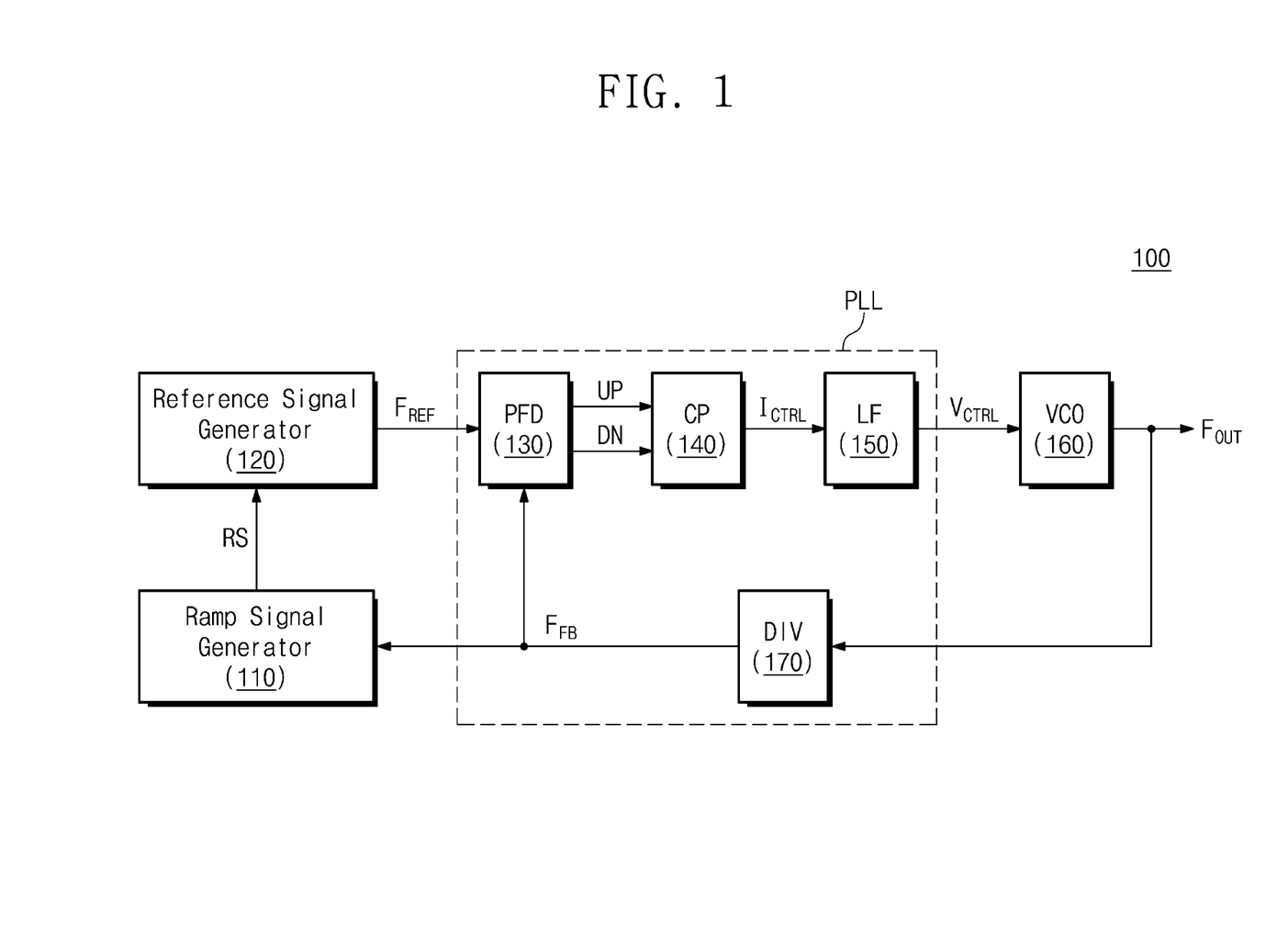
FIG. 1 is a block diagram illustrating a configuration of an FMCW generator according to an embodiment of the inventive concept.

FIG. 1 is a block diagram illustrating a configuration of a frequency-modulated continuous wave (FMCW) generator 100 according to an embodiment of the inventive concept. The FMCW generator 100 includes a ramp signal generator 110, a reference signal generator 120, a phase frequency detector 130, a charge pump 140, a loop filter 150, a voltage-controlled oscillator (VCO) 160, and a divider 170.

The ramp signal generator 110 may be configured to generate an analog ramp signal. For example, a ramp signal generator may generate an analog ramp signal RS in response to a feedback signal $F_{FB}$, which is a digital signal. For example, the analog ramp signal RS may be current or voltage. For example, the ramp signal generator 110 may include various active and/or passive elements for generating the analog ramp signal RS. The specific configuration and operation of the ramp signal generator 110 will be described with reference to FIG. 2.

The reference signal generator 120 may generate a reference signal $F_{REF}$ using the ramp signal RS. The waveform of the reference signal $F_{REF}$ and the waveform of the ramp signal RS may be substantially similar to each other (such as a sawtooth wave). For example, the reference signal generator 120 may be implemented with a voltage-controlled crystal oscillator (VCXO) controlled by voltage. In this case, the ramp signal RS may be voltage. Alternatively, the reference signal generator 120 may be implemented with a current-controlled oscillator controlled by current. In this case, the ramp signal RS may be current.

Moreover, a phase locked loop (PLL) may be referred to as including a phase frequency detector 130, a charge pump 140, a loop filter 150, and a divider 170. For example, a PLL-based synthesizer may be referred to as including a VCO 160 in addition to a PLL. A PLL and/or PLL-based synthesizer may be configured to synchronize the phase of the output signal $F_{OUT}$ to a specific frequency so that the phase of the output signal $F_{OUT}$ is not shaken.

The phase frequency detector 130 may compare the phases of the reference signal $F_{REF}$ and the feedback signal $F_{FB}$. For example, when the reference signal $F_{REF}$ is ahead of the feedback signal $F_{FB}$, the phase frequency detector 130 may output an up signal UP, which is logic high and a down signal DN, which is logic low. On the other hand, when the reference signal $F_{REF}$ is behind the feedback signal $F_{FB}$, the phase frequency detector 130 may output an up signal UP, which is logic low and a down signal DN, which is logic high. For example, the feedback signal $F_{FB}$ may be a signal whose output signal $F_{OUT}$ is divided by 1/N. Herein, N may be the divisional ratio of the divider 170.

The charge pump 140 may be configured to convert pulses (i.e., up signal UP and down signal DN) to a control current $I_{CTRL}$. For example, the charge pump 140 may include current source(s) and switch(es) controlled by the up signal UP and the down signal DN.

The loop filter 150 may be configured to convert the control current $I_{CTRL}$ to the control voltage $V_{CTRL}$. For example, the loop filter 150 may include at least one capacitor. Furthermore, the loop filter 150 may remove high frequencies from the control current $I_{CTRL}$. That is, the loop filter 150 may operate as a low pass filter. For example, the loop filter 150 may include at least one capacitor and at least one resistor. However, the loop filter 150 is not limited to this configuration, and may be implemented in various configurations that may operate as a low pass filter.

The VCO 160 may receive the control voltage $V_{CTRL}$ and output the output signal $F_{OUT}$. At this time, the frequency-time graph of the output signal $F_{OUT}$ may follow the waveform of the control voltage $V_{CTRL}$-time graph. For example, if the waveform of the control voltage $V_{CTRL}$-time graph takes the form of a sawtooth wave, it will take the form of a frequency-time graph sawtooth of the output signal $F_{OUT}$.

The divider 170 receives the output signal $F_{OUT}$ and divides the output signal $F_{OUT}$ by the divisional ratio N. That is, the divider 170 divides the output signal $F_{OUT}$ by 1 or N, which is an integer greater than 1, and adjusts the frequency of the input signal $F_{REF}$ of the phase frequency detector 130 in order to precisely control the reference signal $F_{REF}$. The divider 170 may output a signal obtained by dividing the output signal $F_{OUT}$ by N as the feedback signal $F_{FB}$.

Further, the divider 170 may be configured to count the frequency of the output signal $F_{OUT}$. The divider 170 may output pulses having an amplitude corresponding to the counted frequency. For example, if the frequency counted in a certain section is k, the divider 170 may output a pulse having an amplitude corresponding to k.

The FMCW generator 100 of the inventive concept may execute the operations described above repeatedly such that the output signal $F_{OUT}$ may be stabilized. Further, the FMCW generator 100 of the inventive concept may generate an analog ramp signal RS based on the feedback signal $F_{FB}$ which is a digital signal. For this, the ramp signal generator 110 may include a variety of active and/or passive elements. As a result, the configuration of the ramp signal generator 110 may be simplified, and the frequency error and linearity of the ramp signal RS may be improved.

Figure 2:
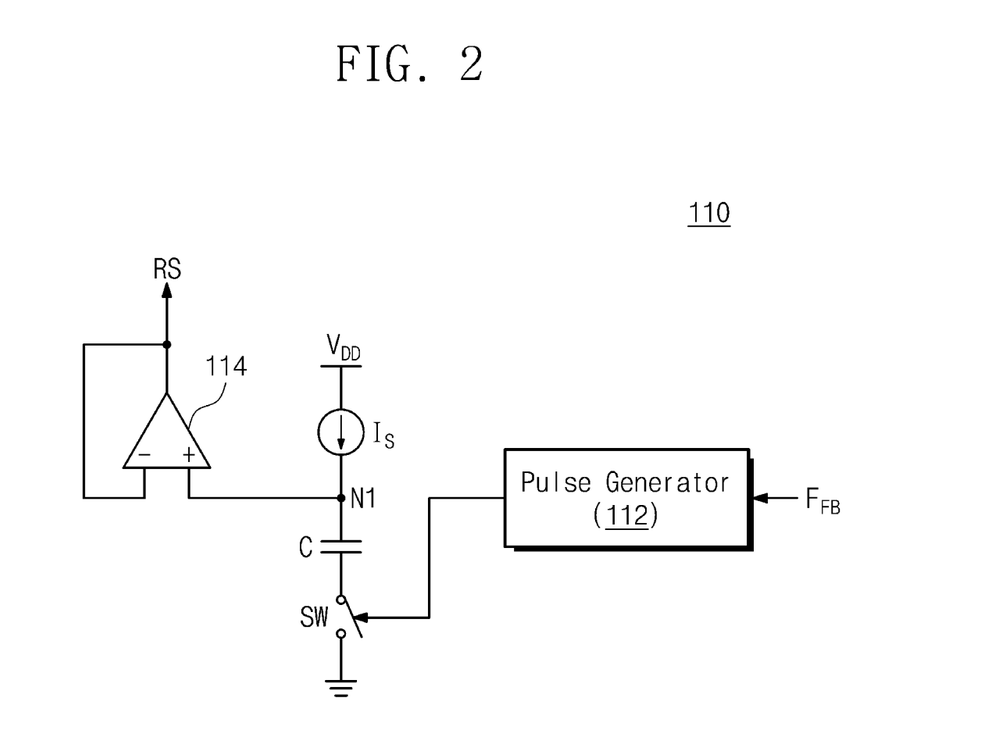
FIG. 2 is a block diagram illustrating an exemplary configuration of a ramp signal generator shown in FIG. 1.

FIG. 2 is a block diagram illustrating an exemplary configuration of the ramp signal generator 110 shown in FIG. 1. The ramp signal generator 114 may include a pulse generator 112, an operational amplifier 114, a current source Is, and a switch SW. To help understanding of the description, FIG. 1 will be described together.

The pulse generator 112 may generate pulses based on the feedback signal $F_{FB}$ outputted from a PLL. For example, the pulse generator 112 may be implemented with a divider. In this case, the pulse generator 112 may output pulses divided by a specific natural number from the feedback signal $F_{FB}$. Alternatively, the pulse generator 112 may be implemented with a PLL or a Delay Locked Loop (DLL). In this case, the pulse generator 112 may output stabilized pulses. Alternatively, the pulse generator 112 may be implemented with a programmable pulse generator.

The pulse generator 112 may initially generate a plurality of pulses in which the length of a logic high section increases linearly. The switch SW may be switched off in a section where the pulses generated by the pulse generator 112 are logic high. In the section where the switch SW is switched off, the charge by the current source Is will be charged in the capacitor C. The potential difference across the capacitor C (i.e., the voltage at the node N1) will also increase linearly because the section where the pulses generated by the pulse generator 112 are logic high increases linearly. The operational amplifier 114 may amplify the voltage at the node N1 to generate a ramp signal RS.

In particular, the pulses initially generated by the pulse generator 112 may be unstable due to various factors (e.g., ambient temperature, noise, etc.). However, since the loop of a PLL is repeated, the output signal $F_{OUT}$ from the VCO 160 will be stabilized. Therefore, in addition to the feedback signal $F_{FB}$ based on the output signal $F_{OUT}$, the pulses outputted from the pulse generator 112 may also be stabilized. Furthermore, since the ramp signal generator 110 of the inventive concept is simply implemented using some active elements and passive elements, the frequency error and linearity of the ramp signal RS may be improved.

Figure 3A:
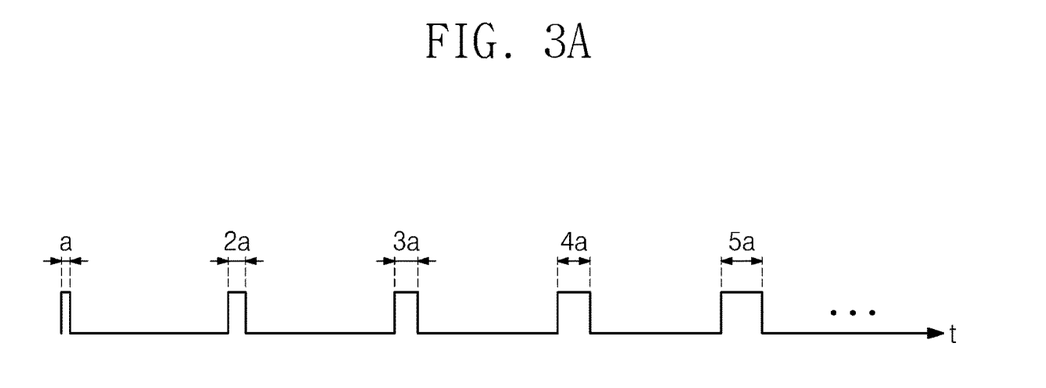
FIG. 3A is a graph illustrating an exemplary waveform outputted from a pulse generator of FIG. 2.
Figure 3B:
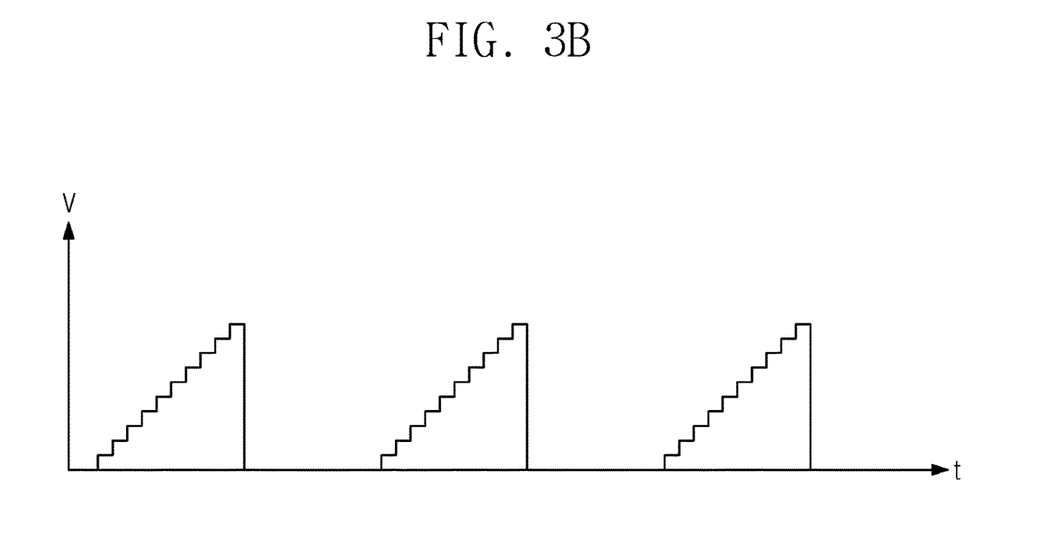
FIG. 3B is a graph illustrating an exemplary potential difference across a capacitor of FIG. 2.

FIG. 3A is a graph illustrating an exemplary waveform outputted from the pulse generator 112 of FIG. 2. FIG. 3B is a graph illustrating an exemplary potential difference across the capacitor C of FIG. 2.

The potential difference across the capacitor C will also increase linearly, as shown in FIG. 3B, by a plurality of pulses whose section that is logic high linearly increases as shown in FIG. 3A. For conciseness or simplicity of illustration, FIGS. 3A and 3B are shown roughly. However, if the period and/or pulse width of the pulses shown in FIG. 3A, are precisely controlled, a voltage-time graph across the capacitor C that increases linearly will be obtained. Furthermore, a plurality of pulses whose section, which is logic high, linearly increases as shown in FIG. 3A are generated a plurality of times, so that a plurality of sawtooth waves shown in FIG. 3B may also be generated.

Figure 4A:
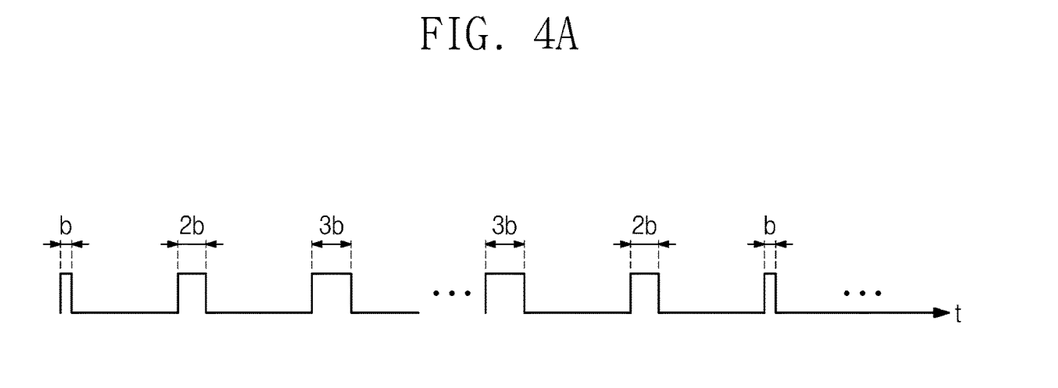
FIG. 4A is a graph illustrating an exemplary waveform outputted from a pulse generator of FIG. 2.
Figure 4B:
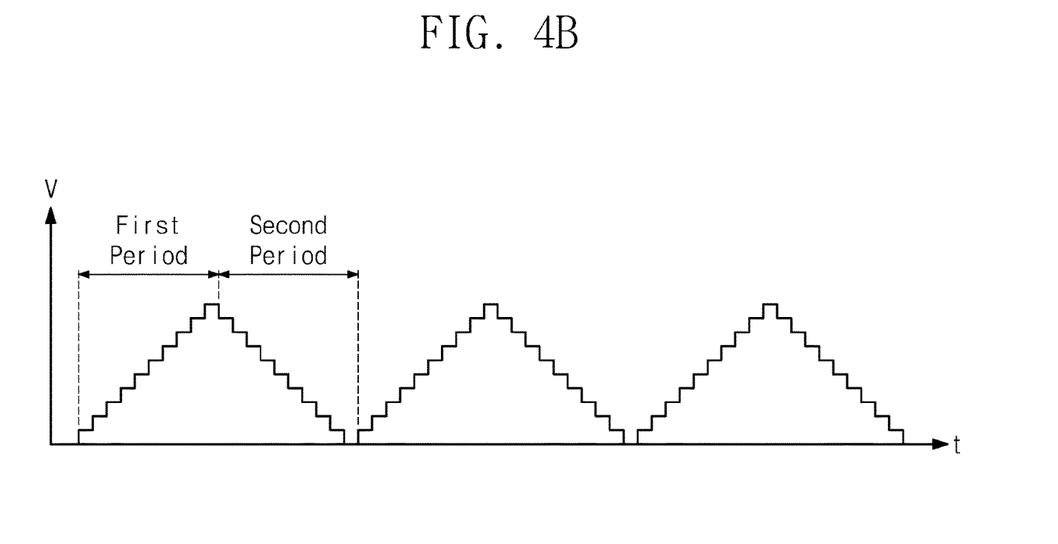
FIG. 4B is a graph illustrating an exemplary potential difference across a capacitor of FIG. 2.

FIG. 4A is a graph illustrating an exemplary waveform outputted from the pulse generator 112 of FIG. 2. FIG. 4B is a graph illustrating an exemplary potential difference across the capacitor C of FIG. 2.

The potential difference across the capacitor C will also increase linearly, as shown in FIG. 3B, by a plurality of pulses whose section that is logic high linearly increases as shown in FIG. 4A. This is shown as a voltage graph in the first section of FIG. 4B. And, the potential difference across the capacitor C will be also reduced linearly, as shown in FIG. 3B, by a plurality of pulses whose section that is logic high is linearly reduced as shown in FIG. 4A. This is shown as a voltage graph in the second section of FIG. 4B.

Furthermore, a plurality of pulses whose section, which is logic high, linearly increases and a plurality of pulses whose section, which is logic high, is linearly reduced as shown in FIG. 4A are generated a plurality of times, so that a plurality of sawtooth waves shown in FIG. 4B may also be generated.

Figure 5:
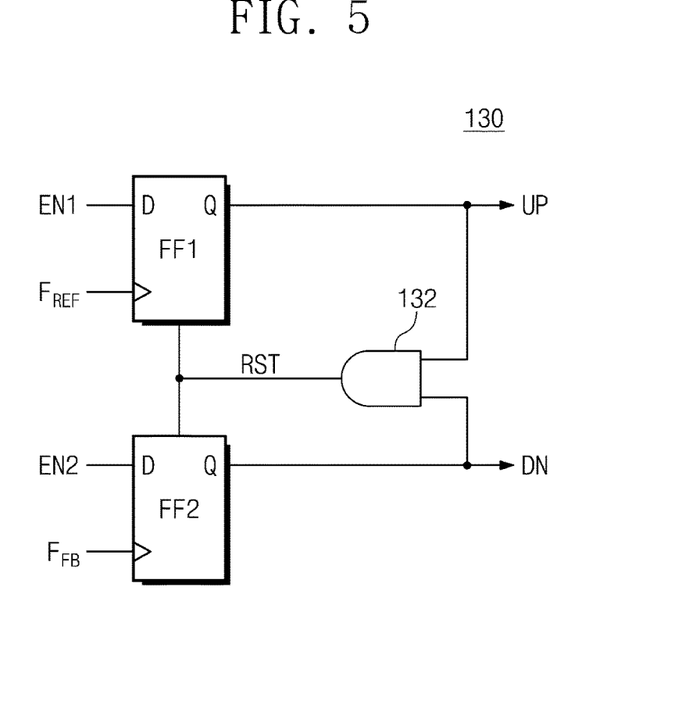
FIG. 5 is a block diagram illustrating an exemplary configuration of a phase frequency detector shown in FIG. 1.

FIG. 5 is a block diagram illustrating an exemplary configuration of the phase frequency detector 130 shown in FIG. 1. The phase frequency detector 130 may include a first flip-flop FF1, a second flip-flop FF2, and a reset unit 132. For example, the first flip-flop FF1 and the second flip-flop FF2 may be D flip-flops. For example, the reset section 132 may be a logical product gate (i.e., an AND gate).

The phase frequency detector 130 compares the time point at which the reference signal $F_{REF}$ is sampled by the first flip-flop FF1 and the time at which the feedback signal $F_{FB}$ is sampled by the second flip-flop to determine an UP value and a DN value.

As shown in FIG. 5, the phase frequency detector 130 may change the UP value from a first logic value to a second logic value when the rising edge of the reference signal $F_{REF}$ is inputted. Similarly, the phase frequency detector 130 may change the DN value from the first logic value to the second logic value when the rising edge of the feedback signal FFE is inputted. The phase frequency detector 130 may change both the UP value and the DN value to the first logic if both the UP value and the DN value are second logical values.

However, the phase frequency detector included in the FMCW generator of the inventive concept is not limited thereto. This drawing is merely an exemplary configuration, and various configurations for detecting the phase difference between the reference signal $F_{REF}$ and the feedback signal $F_{FB}$ may be adopted.

Figure 6:
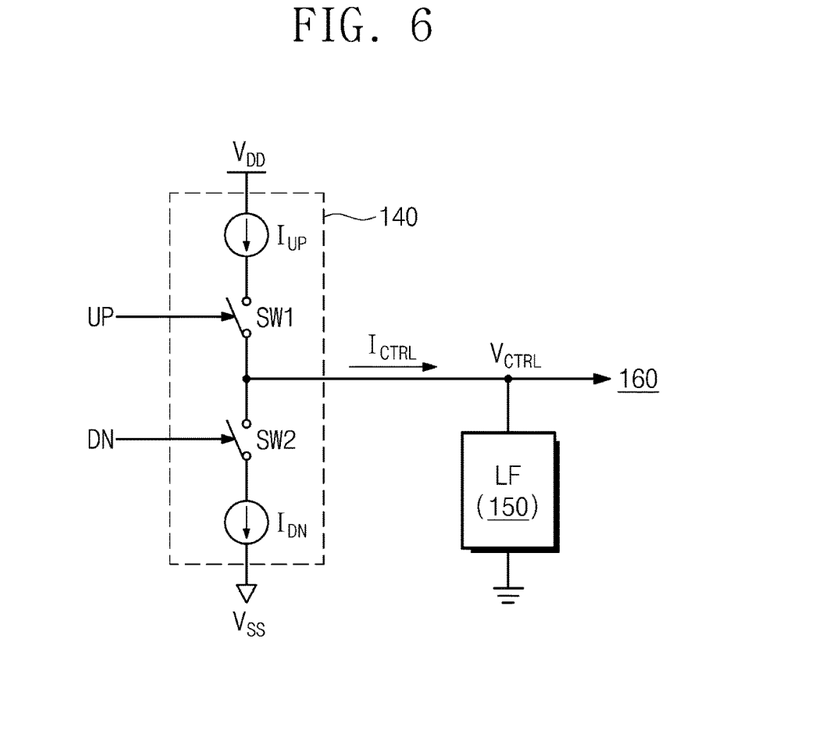
FIG. 6 is a block diagram illustrating an exemplary configuration of a charge pump and a loop filter shown in FIG. 1.

FIG. 6 is a block diagram illustrating an exemplary configuration of the charge pump 140 and the loop filter 150 shown in FIG. 1. Referring to FIG. 6, the charge pump 140 may include a plurality of current sources $I_{UP}$ and $I_{DN}$ and a plurality of switches SW1 and SW2. However, this configuration is only for the sake of understanding, and the configuration of the charge pump 140 is not limited thereto.

If the first switch SW1 is switched on by the up signal UP, the charge by the first current source $I_{UP}$ will be stored in at least one capacitor (not shown) included in the loop filter 150. If the second switch SW2 is switched on by the down signal DN, the charge by the second current source $I_{DN}$ will be stored in at least one capacitor (not shown) included in the loop filter 150. That is, the control current $I_{CTRL}$ is the difference between the first current by the first current source $I_{UP}$ and the second current by the second current source $I_{DN}$. The charge by the control current $I_{CTRL}$ is stored in at least one capacitor (not shown) included in the loop filter 150, so that the potential of the node N2 may be represented by the control voltage $V_{CTRL}$.

Furthermore, the loop filter 150 may remove high frequencies from the control current $I_{CTRL}$. Various filters may be employed to perform the function of a low pass filter. For example, the loop filter 150 may further include at least one capacitor and at least one resistor.

Figure 7A:
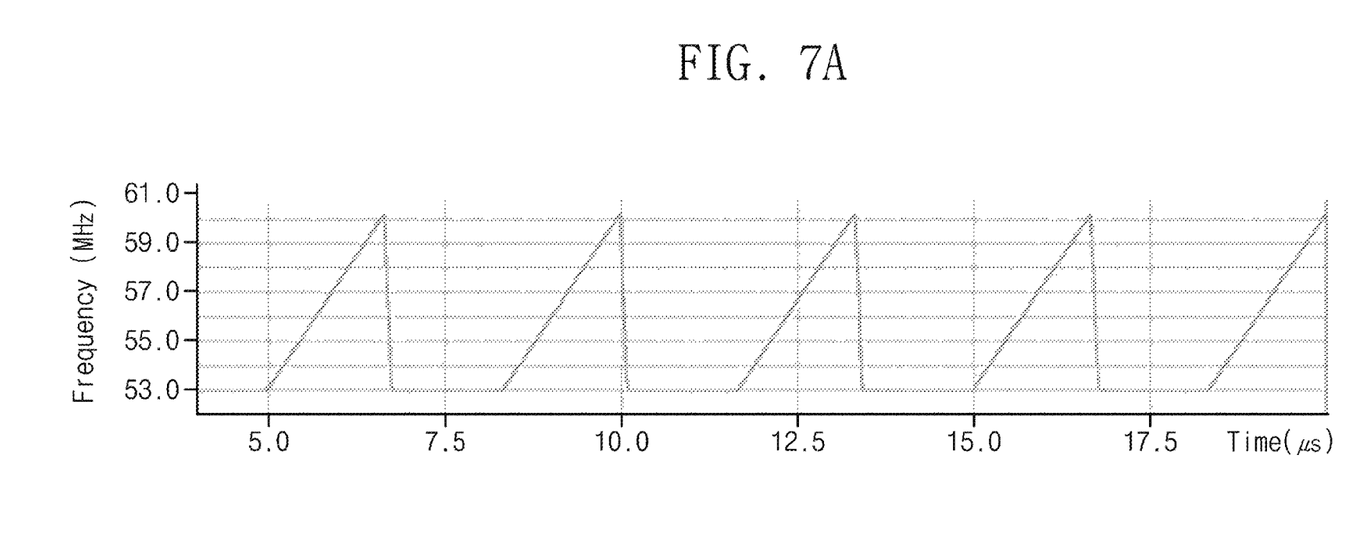
FIGS. 7A to 7C are graphs showing simulation results of an FMCW generator according to an embodiment of an inventive concept.
Figure 7B:
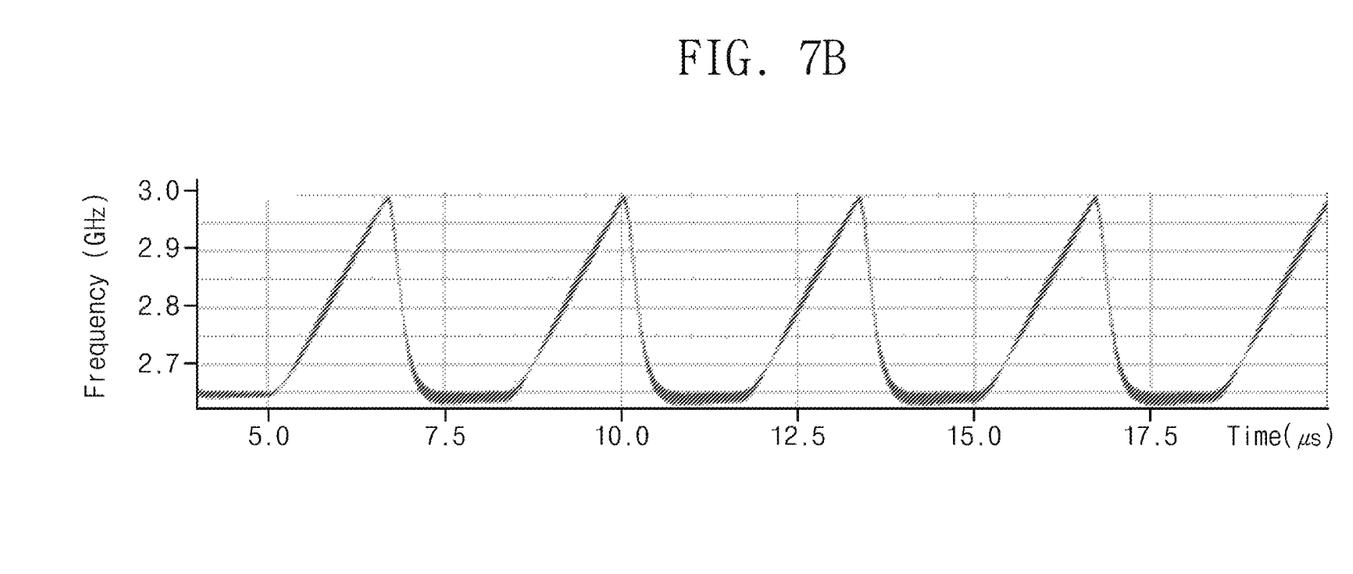
Figure 7C:
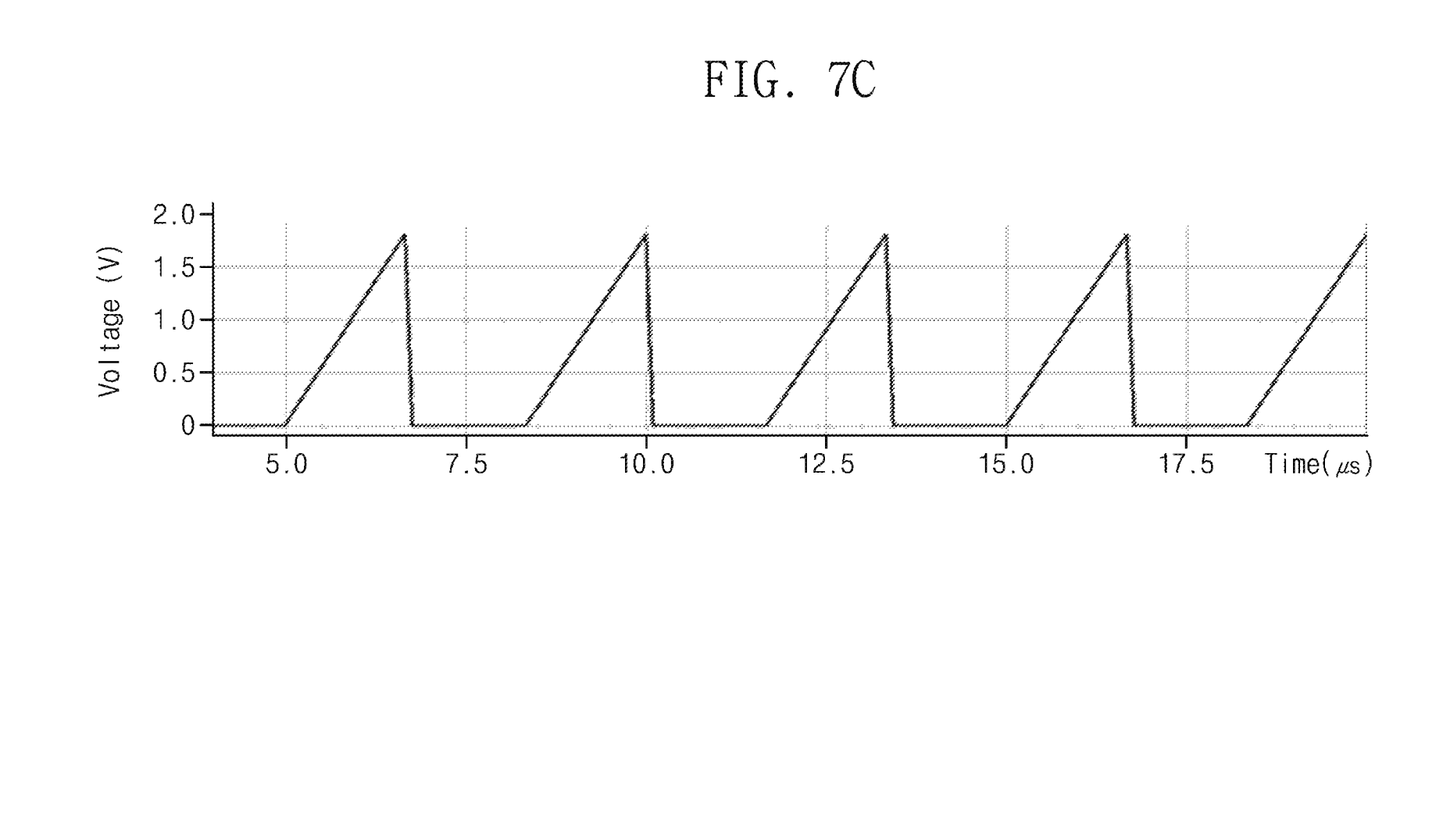

FIGS. 7A to 7C are graphs showing simulation results of an FMCW generator according to an embodiment of an inventive concept. For example, FIG. 7A shows the output waveform of the reference signal generator 120 (see FIG. 1). FIG. 7B shows the output waveform of the VCO 160 (see FIG. 1). FIG. 7C shows the output waveform of the ramp signal generator 110 (see FIG. 1).

Referring to FIGS. 7A, 7B and 7C together with FIG. 1, a signal outputted from the reference signal generator 120 is inputted to a PLL, and the PLL operates, so that it may be seen that a stable sawtooth wave as shown in FIG. 7B is generated. And, based on the feedback signal $F_{FB}$, it may be seen that a stable ramp signal RS is generated as shown in FIG. 7C.

Figure 8:
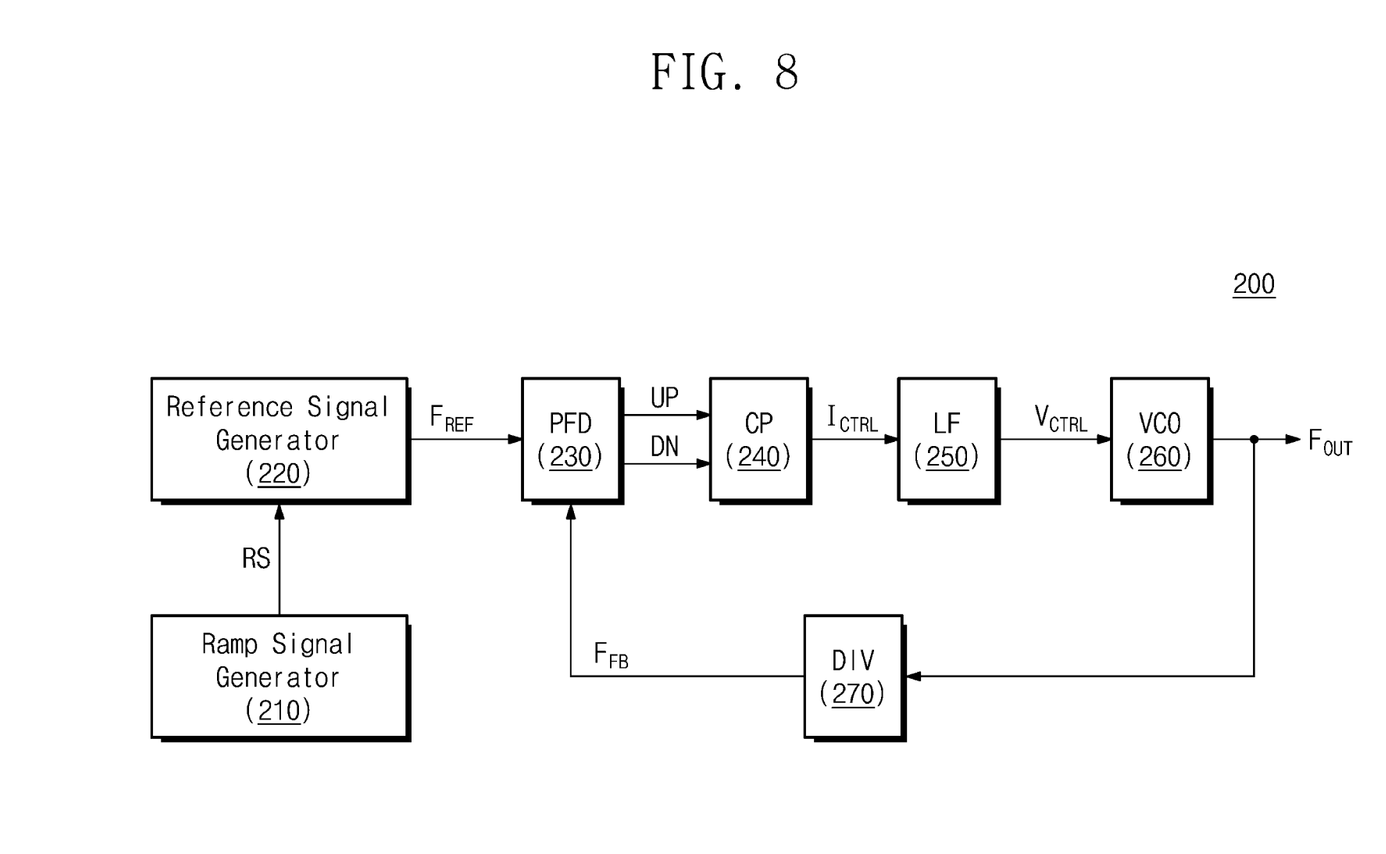
FIG. 8 is a block diagram illustrating an FMCW generator according to another embodiment of the inventive concept.

FIG. 8 is a block diagram illustrating an FMCW generator according to another embodiment of the inventive concept. The FMCW generator 200 includes a ramp signal generator 210, a reference signal generator 220, a phase frequency detector 230, a charge pump 240, a loop filter 250, a VCO 260, and a divider 270.

The configuration and operation of the FMCW generator 200 shown in FIG. 8 is substantially the same as or similar to the FMCW generator 100 described with reference to FIGS. 1 to 7 Therefore, redundant description will be omitted.

However, the ramp signal generator 210 of the FMCW generator 200 may not be based on the feedback signal $F_{FB}$. That is, the ramp signal generator 210 may be configured to generate a plurality of pulses whose linearly increasing section is logic high, as shown in FIG. 3A. Alternatively, the ramp signal generator 210 may be configured to generate a plurality of pulses whose linearly increasing section is logic high and a plurality of pulses whose linearly reducing section is logic high, such, as shown in FIG. 4A.

Further, the FMCW generator 200 may be configured to generate the sawtooth waves shown in FIG. 3B or FIG. 4B based on the ramp signal generator 210.

Figure 9:
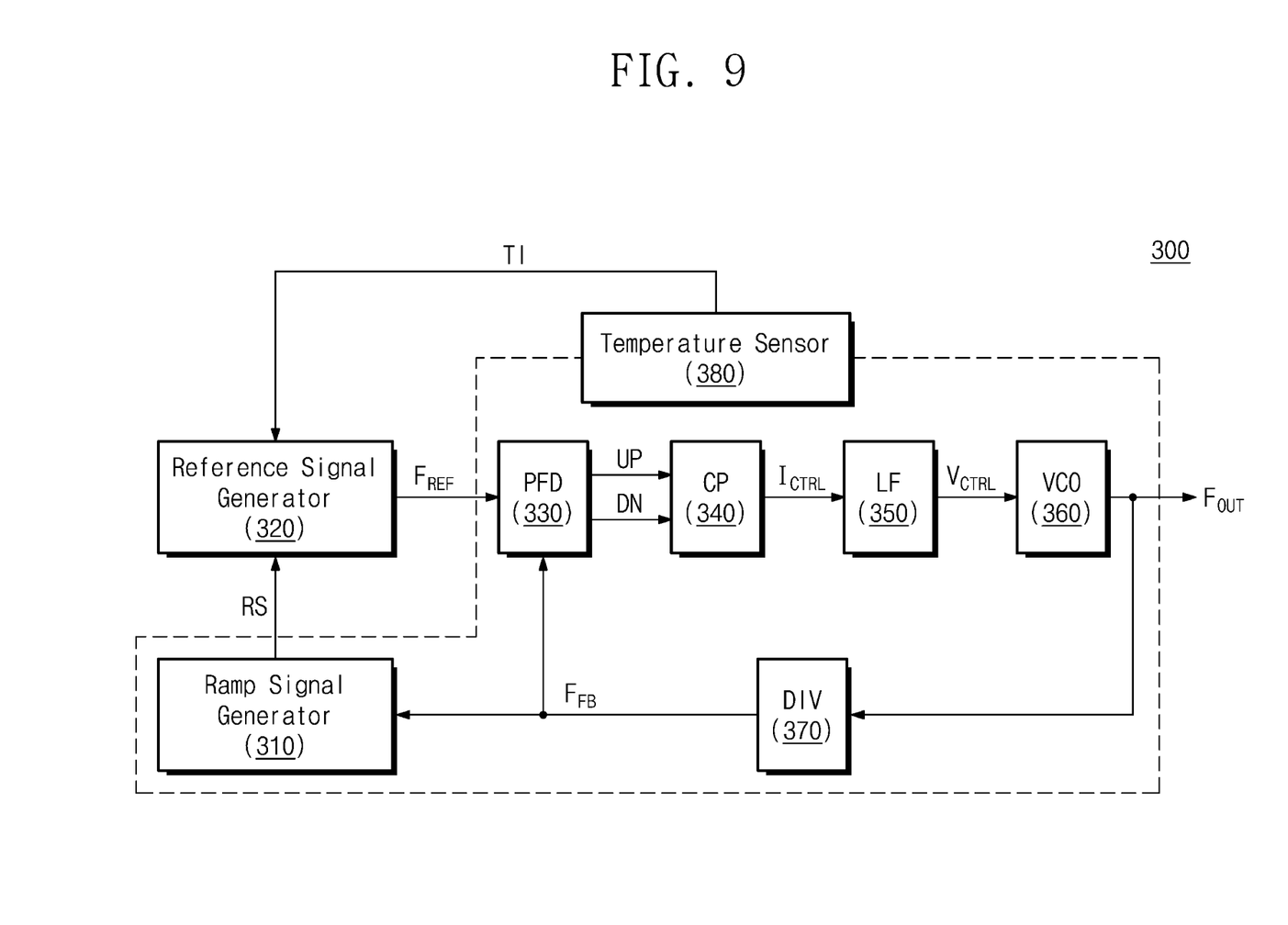
FIG. 9 is a block diagram illustrating an FMCW generator according to another embodiment of the inventive concept.

FIG. 9 is a block diagram illustrating an FMCW generator according to another embodiment of the inventive concept. The FMCW generator 300 includes a ramp signal generator 310, a reference signal generator 320, a phase frequency detector 330, a charge pump 340, a loop filter 350, a VCO 360, a divider 370, and a temperature sensor 380. The configuration and operation of the FMCW generator 300 shown in FIG. 9 is substantially similar to the FMCW generators 100 and 200 described with reference to FIGS. 1 to 8 Therefore, redundant description will be omitted.

The reference signal generator 320 may be controlled not only by voltage but also by temperature. For example, the reference signal generator 320 may be implemented with a voltage-controlled temperature-controlled crystal oscillator (VCTCXO) controlled by voltage and temperature.

The temperature sensor 380 may sense the temperature of the FMCW generator 300. The temperature sensor 380 may deliver information TI about the sensed temperature to the reference signal generator 320. The reference signal generator 320 may generate a reference signal $F_{REF}$ based on the ramp signal RS as well as the temperature information TI. Therefore, the output signal $F_{OUT}$ (i.e., FMCW) may be further stabilized.

Figure 10:
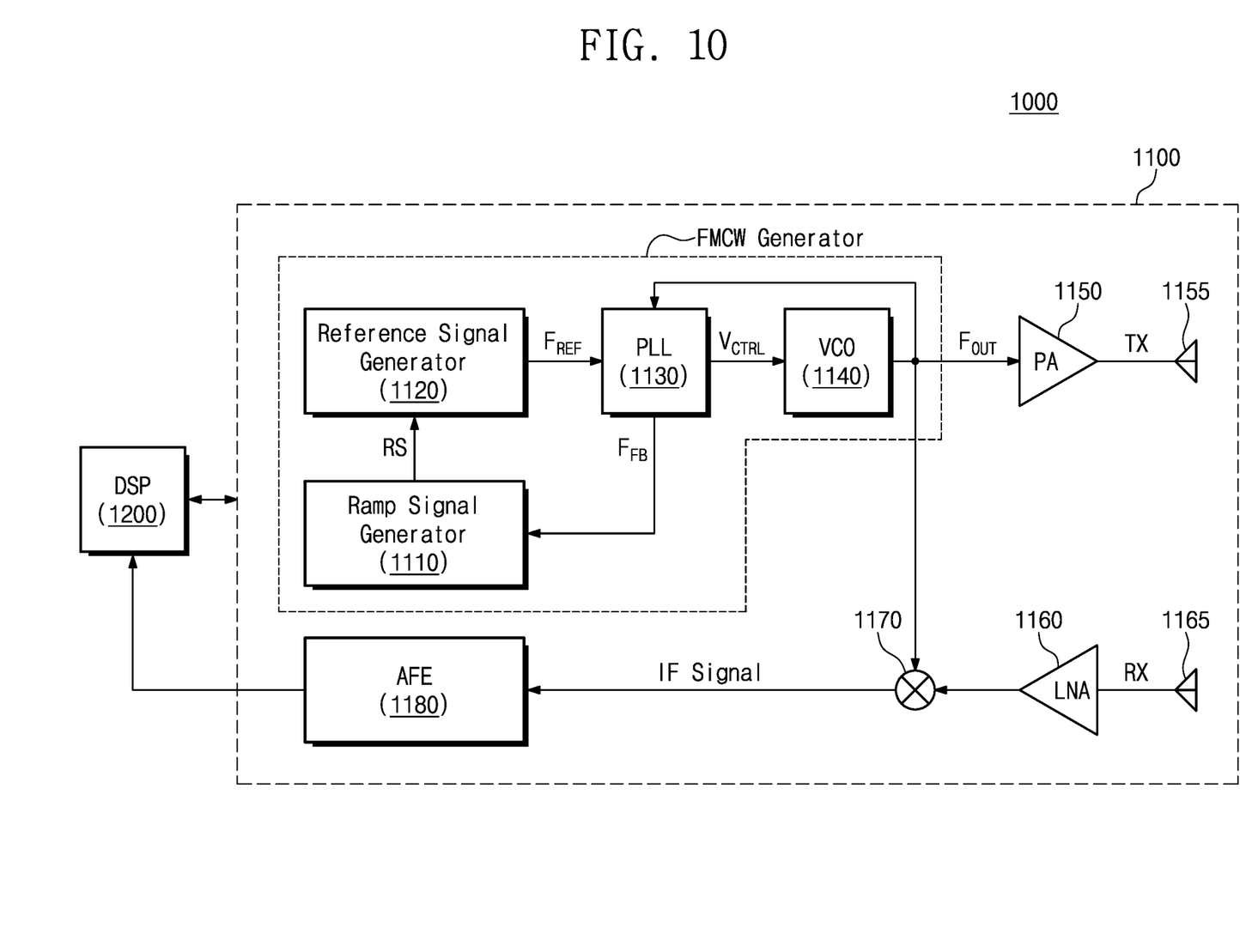
FIG. 10 is a block diagram illustrating an exemplary configuration of an FMCW radar system to which an FMCW generator according to an embodiment of the inventive concept is applied.

FIG. 10 is a block diagram illustrating an exemplary configuration of an FMCW radar system to which an FMCW generator according to an embodiment of the inventive concept is applied. The FMCW radar system 1000 may include an RF module 1100 and a digital signal processor 1200.

The RF module 1100 may include a ramp signal generator 1110, a reference signal generator 1120, a PLL 1130, and a VCO 1140, which constitute an FMCW generator of the inventive concept. The RF module 1100 may further include a power amplifier (PA) 1150, an antenna 1155, a low-noise amplifier (LNA) 1160, and a reception antenna 1165. Further, the RF module 1100 may further include a mixer 1170 and an analog front end 1180.

The FMCW signal $F_{OUT}$ outputted from the FMCW generator may be amplified by the PA 1150 and then transmitted through the transmission antenna 1155 as a transmission signal TX. The reception signal RX, which is the transmission signal TX reflected by a target (not shown), may be received through the reception antenna 1165.

The mixer 1170 may mix the reception signal RX with the transmission signal TX to generate an intermediate frequency IF and the FMCW radar system 1000 may obtain information about a target (not shown) from the intermediate frequency IF.

The analog front end (AFE) 1180 may perform a preprocessing operation on the intermediate frequency signal IF prior to processing by the digital signal processor 1200. For example, the ARE 1180 may include an amplifier, a low pass filter, an analog-to-digital converter, and the like. However, the configuration of the AFE 1180 is not limited thereto, and may include various blocks/circuits for proper processing by the digital signal processor 1200.

The digital signal processor 1200 may perform various calculations based on the output signal of the AFE 1180. For example, the digital signal processor 1200 may calculate information about a target (not shown) (e.g., distance to the target, target size, etc.) using the FMCW signal $F_{OUT}$ and provide it to a user.

The FMCW generators according to the embodiment of the inventive concept and the FMCW radar system including the same have been described. According to the inventive concept, an analog ramp signal is generated based on a feedback signal (i.e., digital signal) outputted from a PLL. Since an analog ramp signal is generated with a relatively simple configuration by using some active element(s) and passive element(s), the frequency linearity of the FMCW signal may be improved. Furthermore, the configuration of the circuit may be simplified to reduce power consumption.

According to the inventive concept, FMCW may be generated at high speed by using an analog ramp signal generated by analog elements.

Furthermore, according to the inventive concept, the linearity of FMCW may be improved by using an analog ramp signal generated by analog elements.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A frequency-modulated continuous wave generator comprising:
    a ramp signal generator configured to generate an analog ramp signal;
    a reference signal generator configured to receive the analog ramp signal from the ramp signal generator and generate a reference signal based on the analog ramp signal;
    a phase locked loop configured to output a control voltage based on the reference signal; and
    a voltage-controlled oscillator configured to generate a frequency-modulated continuous wave based on the control voltage,
    wherein the ramp signal generator is further configured to generate the analog ramp signal based on a feedback signal based on the frequency-modulated continuous wave.

2. The frequency-modulated continuous wave generator of claim 1, wherein the ramp signal generator comprises:
    a pulse generator configured to generate a plurality of pulses based on the feedback signal;
    a switch configured to switch-on or switch-off in response to each of the plurality of pulses, one end of the switch being connected to a ground;
    a capacitor configured to store charges of a current source according to the plurality of pulses, one end of the capacitor being connected to another end of the switch;
    a current source connected to another end of the capacitor; and
    an operational amplifier configured to amplify a potential difference across the capacitor, the operational amplifier being connected to the other end of the capacitor.

3. The frequency-modulated continuous wave generator of claim 2, wherein the reference signal generator is a voltage-controlled crystal oscillator (VCXO), and the reference signal generator generates the reference signal based on an output voltage of the operational amplifier.

4. The frequency-modulated continuous wave generator of claim 2, wherein the phase locked loop comprises:
    a phase frequency detector configured to detect a phase difference between the reference signal and the feedback signal;
    a charge pump configured to generate a control current based on signals outputted from the phase frequency detector;
    a loop filter configured to convert the control current to the control voltage; and
    a divider configured to count or divide the frequency-modulated continuous wave to generate the feedback signal.

5. The frequency-modulated continuous wave generator of claim 4, wherein the feedback signal comprises a plurality of pulses whose logic high section is increased linearly.

6. The frequency-modulated continuous wave generator of claim 2, wherein the pulse generator is implemented with at least one of a divider, a phase locked loop, a delay locked loop, and a programmable pulse generator.

7. The frequency-modulated continuous wave generator of claim 1, further comprising:
    a temperature sensor configured to sense a temperature of the frequency-modulated continuous wave generator,
    wherein the reference signal generator is further configured to generate the reference signal by further considering a detection result of the temperature sensor.

8. The frequency-modulated continuous wave generator of claim 7, wherein the reference signal generator is a voltage-controlled temperature-controlled crystal oscillator (VCTCXO).

9. A frequency-modulated continuous wave radar system comprising:
    a reference signal generator configured to generate a reference signal based on an analog ramp signal;
    a phase locked loop configured to output a control voltage based on the reference signal;
    a voltage-controlled oscillator configured to generate a frequency-modulated continuous wave based on the control voltage;
    a ramp signal generator configured to generate the analog ramp signal based on a feedback signal based on the frequency-modulated continuous wave;
    a mixer configured to mix a reception signal obtained by reflecting a transmission signal based on the frequency-modulated continuous wave by a target with the frequency-modulated continuous wave to generate an intermediate frequency signal; and
    a digital signal processor configured to calculate information about the target based on the intermediate frequency signal.

10. The frequency-modulated continuous wave radar system of claim 9, wherein the ramp signal generator comprises:
    a pulse generator configured to generate a plurality of pulses based on the feedback signal;
    a capacitor configured to store charges of a current source according to the plurality of pulses; and
    an operational amplifier configured to amplify a potential difference across the capacitor.

11. The frequency-modulated continuous wave radar system of claim 10, wherein the reference signal generator is a voltage-controlled crystal oscillator (VCXO), and the reference signal generator generates the reference signal based on an output voltage of the operational amplifier.

12. The frequency-modulated continuous wave radar system of claim 10, wherein the phase locked loop comprises:
- a phase frequency detector configured to detect a phase difference between the reference signal and the feedback signal;
- a charge pump configured to generate a control current based on signals outputted from the phase frequency detector;
- a loop filter configured to convert the control current to the control voltage; and
- a divider configured to count or divide the frequency-modulated continuous wave to generate the feedback signal.

13. The frequency-modulated continuous wave radar system of claim 10, wherein the pulse generator is implemented with at least one of a divider, a phase locked loop, a delay locked loop, and a programmable pulse generator.

14. The frequency-modulated continuous wave radar system of claim 9, further comprising:
- a temperature sensor configured to sense a temperature of the frequency-modulated continuous wave generator,
- wherein the reference signal generator is further configured to generate the reference signal by further considering a detection result of the temperature sensor.

15. The frequency-modulated continuous wave radar system of claim 14, wherein the reference signal generator is a voltage-controlled temperature-controlled crystal oscillator (VCTCXO).

* * * * *